United States Patent
Mori et al.

(10) Patent No.: US 6,456,003 B1
(45) Date of Patent: Sep. 24, 2002

(54) ORGANIC ELECTROLUMINESCENT DEVICES AND PANELS

(75) Inventors: Kenji Mori; Yoshikazu Sakaguchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/494,766

(22) Filed: Jan. 31, 2000

(30) Foreign Application Priority Data

Jan. 28, 1999 (JP) .......................................... 11-020552

(51) Int. Cl.$^7$ ................................................. H01J 1/62
(52) U.S. Cl. ...................... 313/504; 313/503; 313/502; 313/506; 428/690; 428/917
(58) Field of Search ................................. 313/498, 499, 313/500–512, 504; 252/506; 428/690, 917, 457

(56) References Cited

U.S. PATENT DOCUMENTS

| | | | | |
|---|---|---|---|---|
| 5,306,572 A | * | 4/1994 | Ohashi et al. | 428/690 |
| 5,783,292 A | * | 7/1998 | Tokito et al. | 428/212 |
| 5,858,564 A | * | 1/1999 | Tamura et al. | 428/690 |
| 5,903,101 A | | 5/1999 | Kijima | 313/506 |
| 6,010,796 A | * | 1/2000 | Kijima | 428/690 |
| 6,150,042 A | * | 11/2000 | Tamano et al. | 428/690 |
| 6,245,449 B1 | * | 6/2001 | Tamano et al. | 428/690 |

FOREIGN PATENT DOCUMENTS

| | | |
|---|---|---|
| JP | 3-84892 | 4/1991 |
| JP | 3-141588 | 6/1991 |
| JP | 3-274695 | 12/1991 |
| JP | 4-133286 | 5/1992 |
| JP | 4-254887 | 9/1992 |
| JP | 5-21165 | 1/1993 |
| JP | 5-62523 | 3/1993 |
| JP | 6-5365 | 1/1994 |
| JP | 6-212151 | 8/1994 |
| JP | 6-350133 | 12/1994 |
| JP | 7-11244 | 1/1995 |
| JP | 8-185973 | 7/1996 |
| JP | 8-330071 | 12/1996 |
| JP | 9-204985 | 8/1997 |

OTHER PUBLICATIONS

Article "Applied Physics Letters", vol. 51, Sep. 21, 1987, pp. 913–915.

Article "Bunseki", pp. 457–463.

Article "Molecular Electronics and Bioelectronics", vol. 7, 1996, pp. 1–15.

* cited by examiner

*Primary Examiner*—Robert H. Kim
*Assistant Examiner*—Juric Yun
(74) *Attorney, Agent, or Firm*—Foley & Lardner

(57) ABSTRACT

A super thin film is composed of an organic compound having a sulfur-atom-containing substituent in a specific structure, such as mercapto, sulfide and disulfide groups. Among them, the most preferred one is an alkyl mercapto group represented by —$(CH_2)_n$SH in which n is an integer of 1–10. The super thin film is then introduced into the interface between at least one electrode and an organic layer being in contact therewith for receiving carriers from the electrode and delivering the carriers to the organic layer to provide organic EL devices and EL panels. The compound also has a molecular structure similar to that of an organic material at forms the organic layer. The compound can suppress the generation of dark spots and the increase of power consumption. Therefore, it is possible to manufacture organic EL devices with an excellent durability and a smaller increase in power consumption and also panels using the devices.

8 Claims, 2 Drawing Sheets

F I G. 3
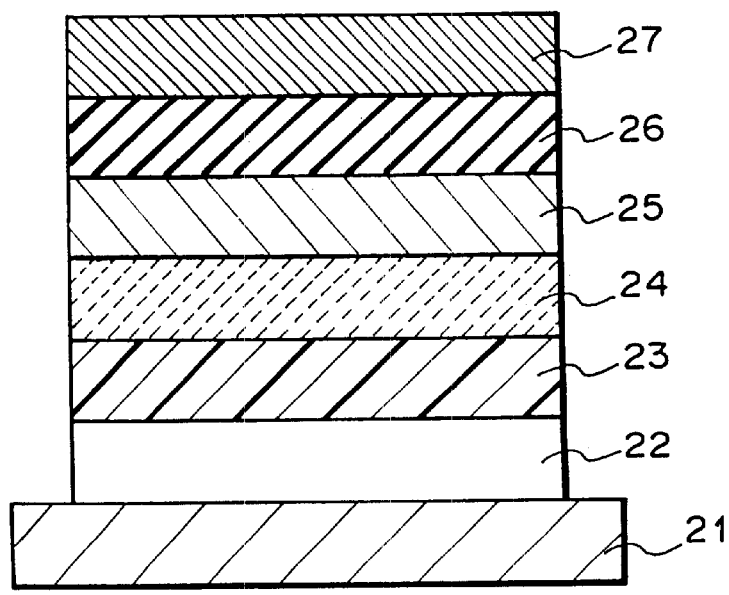
F I G. 4
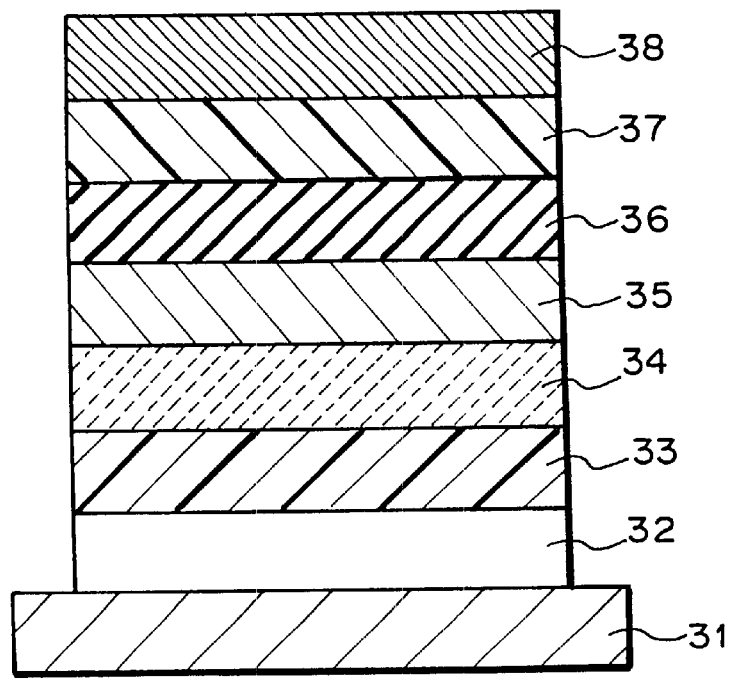

ORGANIC ELECTROLUMINESCENT DEVICES AND PANELS

BACKGROUND OF THE INVENTION

1. Field of the Invention

The present invention relates to an organic electroluminescent device and a panel for use in a plane light source and display device.

2. Description of the Related Art

Electroluminescent devices (hereinafter simply referred to as "EL devices") are favorably useful for a plane display device of self-light-emission type. Among those, unlike inorganic EL devices, organic EL devices are not required to drive with AC at a high voltage. In addition, they can be easily multi-colored due to the variety of organic compounds. Thus, their applications to a full-color display and so forth are expected and greatly studied to develop a structure with a high brightness at a low voltage.

The inorganic EL device causes light emissions of electric field exciting type. On the other hand, the organic EL device operates by injecting holes from the anode (positive electrode) and electrons from the cathode (negative electrode), and causes light emissions of carrier injection type. Positive and negative carriers injected from both electrodes respectively travel toward their opposite electrodes to generate excitons from their recombination. The light emissions of the organic EL device are ones emitted when the excitons are relieved.

A high-purity single crystalline anthracene has been used to study the organic EL device. Anthracene has low brightness and light emission efficiency values while it requires a high voltage application, and is poor in stability.

C. W. Tang et al of Eastman Kodak Co. reported in 1987 that they could achieve a stable light emission with a high brightness at a low voltage with a two-layered laminate structure of organic thin films. Their device had an organic layer, consisting of a two-layered laminate structure with a light emission layer and a hole transportation layer, which was sandwiched between a pair of electrodes and exhibited an unprecedented excellent property of 1,000 cd/cm$^2$ at an applied voltage of 10 V (Tang et al, *Appl. Phys. Lett.*, 51, 913 (1987)). Since then, the research and development of organic EL devices was sharply activated.

An electron transportation layer may recently be formed between the cathode and the light emission layer in addition to the light emission and hole transportation layers. A hole injection layer may also be formed between the hole transportation layer and the anode. Some light emission materials such as tris-(8-hydroxyquinolinol)aluminum (hereinafter referred to as Alq) represented by the following structural formula (1) may also serve as electron transportation materials.

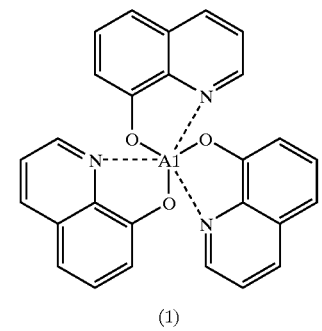

[Formula 1]

(1)

On the other hand, there are materials that serve as hole transportation and light emission materials. The light emission materials include the above-mentioned aluminum complex and distyrylarylene derivative {structural formula (2)}. The hole transportation materials include: diamine compounds such as N,N'-diphenyl-N,N'-bis(3-methylphenyl)-1,1'-biphenyl-4,4'-diamine (hereinafter referred to as TPD) {structural formula (3)}; and N,N'-diphenyl-N,N'-bis(α-naphthyl)-1,1'-biphenyl-4,4'-diamine(hereinafter referred to as α-NPD) {structural formula (4)}, and poly(vinylcarbazole).

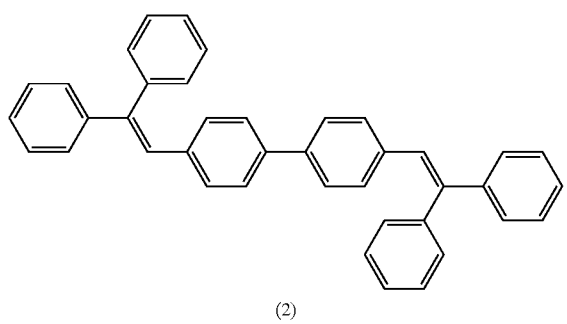

[Formula 2]

(2)

-continued

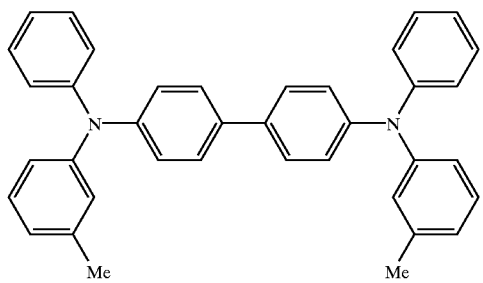

[Formula 3]

(3)

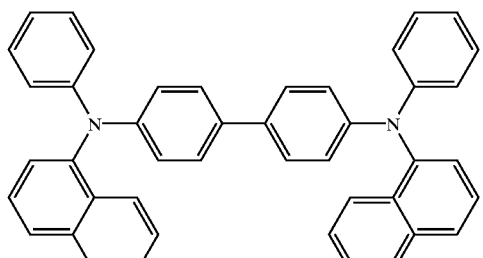

[Formula 4]

(4)

The electron transportation materials other than Alq include 3-(4-biphenylyl)-4-phenyl-5-(4-t-butylphenyl)-1,2,4,-triazole (hereinafter referred to as TAZ) {structural formula (5)}.

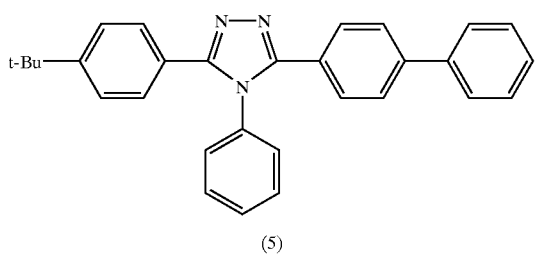

[Formula 5]

(5)

The hole injection materials include 4,4',4"-tris(3-methylphenylphenylamino)triphenylamine (hereinafter referred to as m-MTDATA); and phthalocyanines such as copper phthalocyanine.

Materials that form various organic layers are not limited to the above-mentioned materials, and various organic compounds have been developed for the purpose of achieving high brightness and high efficiency. After a long period of continuous driving, however, such phenomena are observed that a dark spot without a light emission ability is generated and grown even in the organic compound of high brightness and efficiency and a drive voltage must be elevated.

There are possible reasons for the above-mentioned phenomena: the organic materials are thermally degraded; and the electrode and organic layer have a low adhesive property therebetween. Materials useful for the electrode in the organic EL device include metal oxides such as ITO (indium-tin oxide), metals such as gold, silver, magnesium, lithium and aluminum, and their alloys. Other electrically conductive polymers and various semiconductor materials may also serve as the electrode in the organic EL device.

An extremely thin film typically with a thickness of 10–100 nm is used for each organic layer that composes the organic EL device. Therefore, in order to achieve a dense film structure without pinholes, such a material is preferred, which has a high glass transition point (Tg) and excellent amorphous property. A high Tg material for use in the film can increase the thermal stability of the film and improve the durability and thermal resistance of the film for a long period of driving. However, the adhesion of the film to the electrode is not directly correlated with its Tg.

The electrodes for use in the organic EL device mainly use the above-described metal oxides or metals that are typically hydrophilic. On the other hand, the organic materials that are in contact with the electrodes in order to exchange and transport carriers are hydrophobic. Therefore, the interface between the electrode/organic layer can not have a sufficient adhesion property.

As described above, the organic EL device is quite disadvantageous in that the brightness would be lowered due to the generation and growth of dark spots and the power consumption would be increased due to a drive voltage increase after continuous driving.

SUMMARY OF THE INVENTION

The present invention has been made in consideration of such disadvantages and has an object to provide an organic EL device and a panel with its improved adhesion property between an electrode and an organic layer. The device can also be prevented from decreasing its brightness due to the generation and growth of dark spots and from increasing its power consumption due to the elevation of a drive voltage. The present invention also provides a process of manufacturing the device and panel.

The inventors experimented and studied a lot to find out the structure of an organic EL device that can suppress the generation and growth of dark spots and simultaneously have a less amount of elevation of the drive voltage. As a result, the inventors found an approach to eliminate the above-mentioned disadvantages and finally reached to the present invention. The approach is to introduce an interaction caused between an organic compound having a sulfur-atom-containing substituent in a specific structure and the surface of a specific material into an interface between electrode/organic layers in an organic EL device.

The specific material includes metal oxides such as ITO (tin-doped indium oxide), ATO (antimony-doped tin oxide), FTO (fluorine-doped tin oxide), AZO (aluminum-doped zinc oxide), and metal oxides such as tin dioxide and zinc oxide. It also includes metals selected from the group consisting of copper and noble metals (gold, silver, platinum group (platinum, ruthenium, rhodium, palladium, osmium and iridium)), their alloys, and semiconductor compounds.

The semiconductor compounds include a p-type semiconductor compound for use in a hole injection (transportation) electrode and an n-type semiconductor compound for use in an electron injection (transportation) electrode. The p-type semiconductor compound includes a material mainly consisting of either compound of metal chalcogenide, metal halide and metal carbide. In further detail, the p-type semiconductor compound includes a material mainly consisting of either compound of nickel oxide, copper oxide, lead oxide, rare earth oxide, copper iodide and lead sulfide.

The compound having a sulfur-atom-containing substituent in a specific structure includes a substance that contains a sulfur-containing group such as a mercapto group (—SH), a sulfide group (—S—) or a disulfide group (—S—S—) in its molecular structure. The mercapto group (—SH) is, however, more preferred. Among them, an alkyl mercapto group (—(CH$_2$)$_n$SH) (n is an integer of 1–10) is most preferred. The organic compound that includes such structures partially in its molecular structure can bond at its sulfur atom position or positions to the surfaces of such materials with strong interaction as metal oxides including ITO, metals selected from the group consisting of copper and noble metals (gold, silver, and platinum group), their alloys, and semiconductor compounds. This is schematically shown in FIG. 1.

This interaction is much stronger than that of an LB film (Langmuir-Blodgett film) formed on the surface of a substrate by the so-called physisorption. (See, for example, Kondo et al, "*Bunseki*", p457 (1997); and K. Kajikawa et al, "*Molecular Electronics and Bioelectronics*", 7(1), 2 (1996)).

The molecular structure that contains a sulfur atom is not particularly limited to the above exemplified three sustituents but can be extended to other structures that would act in the same way as the molecular structure.

The organic EL device of the present invention comprises at least one organic compound thin film including a light emission layer between two electrodes. In its aspect, a super thin film composed of an organic compound having a sulfur-atom-containing substituent in a specific structure is introduced onto the light-emission-layer side surface of at least one electrode. That is, such a super thin film may be introduced into the interface between the anode and the hole transportation layer, the interface between the cathode and the electron transportation layer, or both of the above-mentioned interfaces.

Processing the surface of the electrode forms the super thin film. The electrode whose surface is reformed by introducing the super thin film can be selected among metal oxides such as ITO (Indium Tin Oxide), metals selected from the group consisting of copper and noble metals (gold, silver, and platinum group), their alloys, and semiconductor compounds, as described above. In particular, ITO, gold, silver and so forth have often been used as electrodes in organic EL devices. Therefore, the procedure of the present invention can be widely applied to the results obtained through the previous research and development.

The organic EL device typically uses a material with a high work function for the anode and a material with a low work function for the cathode. The materials for use in the anode may include such metal oxides as ITO, ATO, FTO, AZO, tin dioxide and zinc oxide. The materials for use in the cathode may include metals such as sodium, magnesium and indium, and alloys such as a magnesium-silver alloy and a lithium-aluminum alloy. Materials with relatively lower work functions are preferred for use in the cathode. ITO may be used in the cathode and gold, in the anode, for example.

The organic EL device comprises at least one transparent or translucent electrode to take light out of it. In application to typical displays, it is required to use a transparent or translucent electrode only at one surface side. Therefore, it is also required to take light out of the organic EL device of the present invention without a large loss using at least one transparent or translucent electrode. New sentences are inserted therein.

The structure of a compound having a sulfur-atom-containing substituent for use in the present invention can be directed to a preferred structure according to the material of a carrier transportation layer formed on the electrode. The conception will be explained in more detail. On one hand a compound which has a similar structure to that of a material for use in a hole transportation layer and which has a sulfur-atom-containing substituent is used between the hole transportation layer and the anode. This causes a high affinity between the hole transportation layer and the anode. On the other hand a compound which has a similar structure to that of a material for use in an electron transportation layer and which has a sulfur-atom-containing substituent is used between the electron transportation layer and the cathode. This causes a high affinity between the electron transportation layer and the cathode. These phenomena result from two facts; the interaction between the above-mentioned sulfur atom and the electrode composed of a specific material, and a higher affinity between molecules having similar structures. It is, however, required to design the sulfur-atom-containing substituent so that the substituent may not hinder the above-mentioned interaction due to its configuration.

The sulfur-atom-containing substituent with a configuration that causes a strong interaction with the electrode may include the previously described mercapto, sulfide and disulfide groups. These substituents are expected to achieve a higher adhesion property as the number of those groups increases, but can not be introduced too much to synthesize.

According to the present invention, an organic material includes a molecular skeleton that contains a sulfur atom capable of strongly bonding with the electrode surface and also a skeleton that has a high affinity for the organic layer. The material is interposed as a super thin film into an interface between the electrode and the organic layer. Thus, the adhesion property between the electrode and the organic layer can be improved. Therefore, an organic EL device and organic EL panel with a high durability and less increase in power consumption as well as a process of manufacturing the device and the panel can be provided.

BRIEF DESCRIPTION OF THE DRAWINGS

The present invention will be more fully understood from the following detailed description with reference to the accompanying drawings in which:

FIG. 3 illustrates a second embodiment of the present invention; and

FIG. 4 illustrates a third embodiment of the present invention.

DETAILED DESCRIPTION OF THE PREFERRED EMBODIMENTS

Embodiments of the present invention will be described in detail below.

Figure 1:
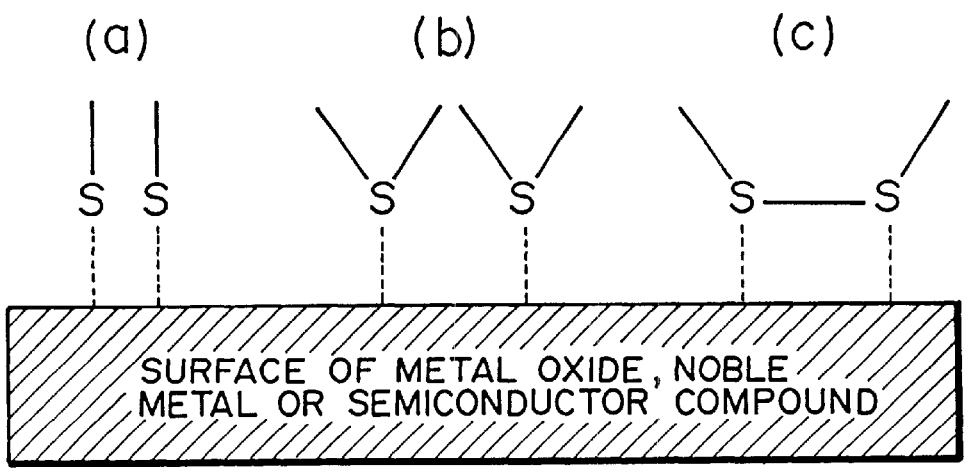
FIG. 1 a schematic diagram illustrating interactions occurred between the surface of an organic compound layer according to the present invention and the surface of a material. The organic compound has a sulfur-atom-containing substituent in a specific structure. The material includes metal oxides such as ITO, metals selected from the group consisting of copper and noble metals (gold, silver, and platinum group), their alloys, and semiconductor compounds. The sulfur-atom-containing substituents are selected from a mercapto group (a), sulfide group (b) and disulfide group (c)
Figure 2:
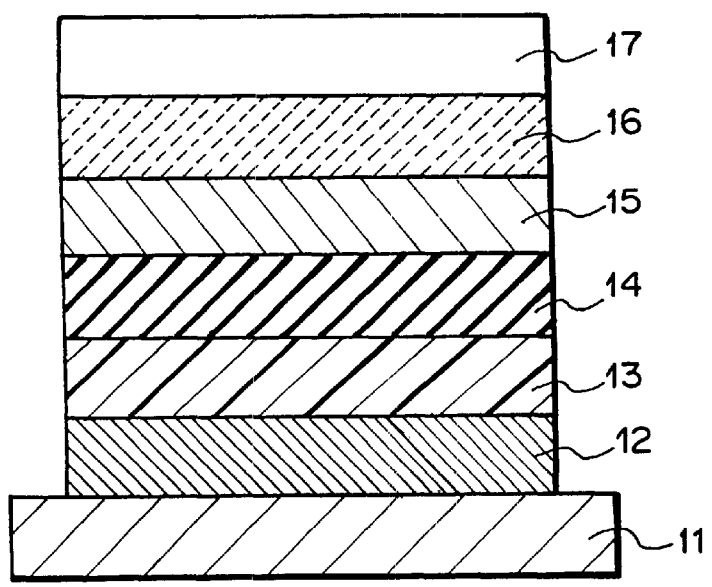
FIG. 2 illustrates a first embodiment of the present invention.

FIG. 2 is a schematic diagram showing the first embodiment of the present invention. As shown in FIG. 2, there are arranged a support substrate 11, an anode 12, an organic compound layer 13, a hole transportation layer 14, a light emission layer 15, an electron transportation layer 16 and a cathode 17. The organic compound layer 13 is composed of an organic compound having a sulfur-atom-containing substituent in a specific structure, such as a mercapto group, a sulfide group and a disulfide group.

In the organic EL device according to the present invention, a plus voltage is available to the anode 12 and a minus voltage is available to the cathode 17. These applied voltages are typically DC but may also be AC. In AC application, light emission can be observed only while the plus voltage is applied to the anode 12. The light emission generated by the voltage application can be taken from the cathode side or anode side. A process order of the device is not limited to a particular one. A process is considered relatively easy, in which the anode 12, the organic compound layer 13, the hole transportation layer 14, the light emission layer 15, the electron transportation layer 16 and the cathode 17 are laminated onto the support substrate 11 in this order.

The support substrate may also be arranged on the cathode instead of the anode in FIG. 2. In this case, a process of forming the cathode first is convenient. In either case, plural multi-layered films may be prepared previously and then adhered to each other. It is substantially impossible to introduce the anode 12 after the organic compound layer 13 is disposed. It is because the organic compound layer 13 is formed in a process to reform the surface of the anode once formed.

The support substrate 11 is not limited to a particular one but is preferably such a material that has a high transmissivity in a light emission wavelength range if it is located on the anode of which light is taken out. Glass and plastics such as polyester, polyacrylate and polycarbonate can be used in practice. The thickness is not limited to a particular one, it should rather be determined in accordance with strength and portability.

The layer 12 of the anode uses metal oxides such as ITO (Indium Tin Oxide), metals selected from the group consisting of copper and noble metals (gold, silver, and platinum group), their alloys, and semiconductor compounds. The anode may be formed according to conventional methods of producing thin films, such as resistance heat evaporation, electron beam plating and sputtering. The thickness is not limited a particular one but is typically 1–500 nm.

The layer 13 is a feature part of the present invention. The layer 13 is composed of an organic compound having a sulfur-atom-containing substituent in a specific structure. Although the skeleton other than the sulfur-atom-containing substituent in a specific structure is not limited to a particular one, a preferred form can be introduced in accordance with the chemical structure of a material of the layer 14. The layer 14 is a hole transportation layer. The organic material for use in the layer 14 has a structure with a high covalent bonding property and a higher hydrophobic property than that of the anode.

The layer 13 serves to improve the adhesive property between the surface of the anode 12 with a relatively higher hydrophilic property and a material composing the layer 14 with a higher hydrophobic property. Among skeletons of the organic compound that composes the layer 13, other skeletons than the sulfur-atom-containing substituent in a specific structure may be realized from structures that exhibit properties similar to those of the layer 14 to cause a high affinity between the layers 13 and 14. On the other hand, since the interface between the layer 13 and the anode 12 has a strong interaction caused between the sulfur atom/electrode surfaces, the adhesion property between the anode 12 and the hole transportation layer 14 can be increased.

The molecular structure of an organic material for use in the hole transportation layer 14 is not limited to a definite one, rather conventional materials such as TPD and α-NPD may be used. If α-NPD is used in the layer 14, the layer 13 may optionally be composed of such a material as an a α-NPD derivative having a mercapto group. In other words, a material composing the layer 13 is not always required to have the α-NPD skeleton, it is rather required to have physicochemical qualities similar to those of the skeleton. For example, it may be one that has a mercapto group introduced into trinaphthylamine or biphenylylamine. The substituent with a sulfur atom is not limited only to a mercapto group (—SH) but may also be a sulfide group (—S—) and a disulfide group (—S—S—). Among them, however, the mercapto group (—SH) is more preferred. An alkyl mercapto group (—(CH$_2$)$_n$SH) (n is an integer of 1–10) is most preferred.

In sulfide or disulfide, it is advisable to carry out a molecular design so that structures at both terminals sandwiching a sulfur atom may have physicochemical qualities similar to those of a material composing the layer 14. When the above-described sulfur-containing substituent, for example, —SH, —S— or —S—S—, is introduced into these skeletons, it may be introduced directly into the skeleton or via a certain skeleton other than the skeleton, such as a straight chain alkyl. The skeleton is not limited to this example. The number of the sulfur-containing substituents is required to be at least one, preferably several. Introduction of too many substituents makes it hard to synthesize a material.

A vacuum evaporation method and an immersing method for use in a study of SAM (Self-Assembled Monolayer) are suitable to form the layer 13, but the formation of the layer 13 is not limited to these examples. This layer 13 is used for the purpose of surface reforming of the electrode. Therefore, it may be formed in the form of a uniform super thin film with a thickness of single to several molecules: approximately 1–10 nm according to the molecular size of a material introduced. Depositing the layer 13 as thick as several 10s to several 100s nm may allow it to serve as a hole transportation layer.

In layer arrangement, the hole transportation layer 14 is one layer consisting of one organic compound or an arrangement with two or more different materials layered. If the hole transportation layer is of laminate type, a layer on the side that is in contact with the anode may be specially called a hole injection layer. Although materials for use in the hole injection layer may include conventionally used materials such as m-MTDATA and copper phthalocyanine, they are not limited in particular to those materials.

There is no special limit to the process of producing the layer 14. An optimal procedure can be selected in accordance with the physicochemical qualities of a material. A vacuum evaporation method and a spin coating method are selectively used in general. It is important to notice that the super thin film 13 on the anode is free of damage. There is no particular limit to the thickness of the film but the thickness is typically about 1–500 nm. If a hole injection layer is introduced thereinto, it is preferred to design the sulfur-containing organic compound in a specific structure of the layer 12 in consideration of its affinity with the hole injection material.

The layer 15 is a light emission layer. There is no particular limit to the material for use in the light emission layer, rather conventionally used materials such as Alq and 4,4'-bis(2,2'-diphenylvinyl)biphenyl (DPVBi) may be used. The material for composing the light emission layer is not always one. Two or more materials may also be used in a mixture. For example, 4-(dicyanomethylene)-2-methyl-6-(p-dimethylaminostyryl)-4H-pyran (DCM) and rubrene may be mixed into Alq. The materials include materials other than these examples.

The layer 16 is an electron transportation layer. There is no particular limit to the material for use in the electron transportation layer, rather materials excellent in electron transportability may be used. For example, Alq used in the light emission layer and triazole derivatives such as TAZ are exemplified. The electron transportation layer is also called a hole block layer in view of its work of hole-blocking. A combination of suitable materials can make a structure that serves as both hole transportation and light emission layers or that serves as both electron transportation and light emission layers.

Each layer described above may also contain other components, which are not related directly to the functions of the layer, such as a binder resin and various additives. Any buffer layer may be interposed into each interface other than the interface between the anode/hole transportation (or injection) layer. All or part of the hole transportation, light emission and electron transportation layers can be formed using oligomers or polymers to realize an organic EL device.

The layer 17 is a cathode. Materials for use in the cathode are required to select materials that have lower work functions than those of materials used for the anode. In use of ITO in the anode, aluminum, silver, indium, magnesium, lithium, calcium, sodium, potassium and cesium are available. In use of gold in the anode, ITO, copper, tungsten, iron, aluminum, silver, indium, magnesium, lithium, calcium, sodium, potassium and cesium are available. In use of silver in the anode, indium, magnesium, lithium, calcium, sodium, potassium and cesium are also available. In use of copper in the anode, tungsten, iron, aluminum, silver, indium, magnesium, lithium, calcium, sodium, potassium and cesium are available.

The cathode may be configured in a mixture or alloy of two or more materials other than the above-described examples. The ratio varies on the combination of materials. For example, a magnesium alloy containing 1–10% by weight of silver and an aluminum alloy containing 0.01–1% by weight of lithium may be used.

Although the organic EL device can be configured using the above-described layers 11–17, an auxiliary electrode other than these layers may also be applied to either of, or both of, the anode and cathode in the present invention. This is directed to ensuring a high transmissivity without increasing the electrode resistance and forming a stable electrode.

The auxiliary electrode is made of a material different from that of the electrode itself and is attached to the electrode made of a metal and so forth on the opposite surface of the light emission layer. An area to which the auxiliary electrode is attached may be the entire of, or part of, the electrode. Since ITO and the like have a high transmissivity and relatively high conductivity, there is no particular need for any auxiliary electrode.

There is no particular limit to materials for use in the auxiliary electrode so long as they have conductivity. ITO and the like which have a transmissivity of 70% or more are preferred. Decreasing the film thickness of the electrode to ensure its transmissivity without any auxiliary electrode would invite an increase in electrode resistance. This causes an increase in wiring resistance and a large loss in supply power when arranging a lot of pixels in an X-Y matrix to produce a panel. The auxiliary electrode is attached only to the electrode of which light is taken out while the other electrode of which no light is taken out may remain to have such a film thickness as to exhibit a sufficiently low resistance. The auxiliary electrodes may be used on both sides.

FIG. 3 is a schematic diagram showing a second embodiment of the present invention. As shown in FIG. 3, there are arranged a support substrate 21, a cathode 22, an organic compound layer 23, an electron transportation layer 24, a light emission layer 25, a hole transportation layer 26 and an anode 27. The layer 23 is composed of an organic compound having a sulfur-atom-containing substituent in a specific structure, such as a mercapto group, a sulfide group and a disulfide group. The mercapto group is more preferred.

In order to emit light, a plus voltage is available to the anode and a minus voltage is available to the cathode as similar to the first embodiment. There is no particular limit to the waveforms of applied voltages. The light generated by the voltage application can be taken from the cathode side or anode side. There is no particular limit to the process order of the device. A relatively easy process is to laminate layers from the cathode first contrary to the first embodiment. Namely, the cathode 22, the organic compound layer 23, the electron transportation layer 24, the light emission layer 25, the hole transportation layer 26 and the anode 27 are laminated onto the support substrate 21 in this order.

The support substrate 21 may also be arranged on the anode side instead of the cathode side in FIG. 3. In this case, a process of forming the anode first is convenient. In either case, plural multi-layered films may be prepared previously and then adhered to each other. It is substantially impossible to introduce the cathode 22 after the organic compound layer 23 is disposed. That is because the organic compound layer 23 is formed in a process to reform the surface of the cathode once formed.

The support substrate 21, electron transportation layer 24, light emission layer 25 and hole transportation layer 26 can be configured to have a construction similar to that of the first embodiment, with freely combined materials. Each layer may also contain other components, which are not directly related to the function of the layer, such as a binder resin and various additives. Any buffer layer may be interposed into each interface other than the interface between the cathode/electron transportation (or injection) layers. All or part of the hole transportation, light emission and electron transportation layers can be formed using oligomers or polymers to realize an organic EL device.

The cathode 22 composed of metal oxides such as ITO, metals selected from the group consisting of copper and noble metals (gold, silver, and platinum group), their alloys, and semiconductor compounds. That is because these materials can strongly interact with a sulfur-atom-containing substituent in a specific structure, such as a mercapto group, a sulfide group and a disulfide group. The cathode can be formed according to conventional methods of producing thin films, such as resistance heat evaporation, electron beam plating and sputtering. There is no special limit to the thickness but the thickness is typically 1–500 nm.

The layer 23 is a feature part of the present invention. The layer 23 is composed of an organic compound having a sulfur-atom-containing substituent in a specific structure. Although there is no particular limit to the skeleton other than the sulfur-atom-containing substituent in a specific structure, a preferred form can be introduced depending on the chemical structure of a material of the layer 24. The layer 24 is an electron transportation layer. The organic material for use in the layer 24 has a structure with a high covalent bonding property and a higher hydrophobic property than the cathode does.

The layer 23 serves to improve the adhesive property between the surface of the cathode 22 with a relatively higher hydrophilic property and the material composing the layer 24 with a higher hydrophobic property. Among skeletons of the organic compound that composes the layer 23, skeletons other than the sulfur-atom-containing substituent in a specific structure may be realized as structures that exhibit properties similar to those of the layer 24 to cause a high affinity between the layers 23 and 24. On the other hand, since the interface between the layer 23 and the cathode 22 has a strong interaction formed between the sulfur atom/electrode surface, the adhesion between the cathode 22 and the electron transportation layer 24 can be increased.

There is no definite limit to the molecular structure of the organic material for use in the electron transportation layer 24, rather conventional materials such as an oxadiazole derivative and triazloe derivatives such as TAZ may be used. If TAZ is used in the layer 24, the molecular structure of the layer 23 may optionally be that of a TAZ derivative having a mercapto group. Furthermore, the molecular structure of the layer 23 is not always required to have the TAZ skeleton, rather any skeleton having a similar molecular structure thereto may be selected. For example, it may be introduced into a 3,4,5-triphenyl-1,2,4-triazloe skeleton or 3,5-bis(biphenylyl)-1,2,4-triazloe skeleton. The substituent with a sulfur atom is not limited only to a mercapto group (—SH). The substituent may also be a sulfide group (—S—) and a disulfide group (—S—S—), but the mercapto group is more preferred. Among them, an alkyl mercapto group (—(CH$_2$)$_n$SH) (n is an integer of 1–10) is most preferred.

In sulfide or disulfide, a preferred molecular design is carried out so that structures of both terminals sandwiching a sulfur atom have physicochemical qualities similar to those of the material composing the layer 24. When a mercapto group is introduced into these skeletons, it may be introduced directly into the skeletons or via a certain skeleton other than the skeletons, such as a straight chain alkyl. The certain skeleton is not limited to this example. The number of the sulfur-atom-containing substituents to be introduced thereinto is required to be at least one, preferably several. Introduction of too many substituents makes it hard to synthesize a material.

A vacuum evaporation method and an immersing method for use in the study of SAM are suitable for forming the layer 23 but there is no particular limit to the formation of the layer 23. The layer 23 is used for the purpose of surface reforming of the electrode. Therefore, it may be formed in the form of a uniform super thin film with a thickness of single to several molecules: approximately 1–10 nm according to the molecule size of a material introduced. In accordance with the chemical structure of a material of the layer 23, the material may be deposited so that the layer 23 is as thick as several 10s to several 100s nm to serve as an electron transportation layer.

There is no limit to materials for use in the anode 27 so long as they have higher work functions than the cathode 22 does. For example, in use of silver in the cathode, aluminum, iron, tungsten, copper, gold, nickel, platinum and ITO are available. In use of ITO in the cathode, gold, nickel and platinum are available. In use of gold in the cathode, nickel and platinum are available. In use of copper in the cathode, gold, nickel and platinum are available. In cases other than the above-described examples, the anode may be configured in a mixture or alloy of two or more materials. In these cases, all materials that have higher work functions than those of the cathode are preferred.

Although the organic EL device can be configured using the above-described layers 21–27, an auxiliary electrode may also be applied to either of, or both of, the anode and cathode in addition to these materials in the present invention. This is directed to ensuring a high transmissivity without increasing the electrode resistance and forming a stable electrode. The auxiliary electrode is made of a material different from that of the electrode itself and is attached to the electrode made of a metal and so forth on the opposite surface of the light emission layer. An area to which the auxiliary electrode is attached may be the entire of, or part of, the electrode. Since ITO has a high transmissivity and relatively high conductivity, there is no particular need for applying any auxiliary electrode thereto.

There is no particular limit to materials for use in the auxiliary electrode so long as they have conductivity. ITO and the like which have a high transmissivity are preferred. If the film thickness of the electrode were decreased to ensure its transmissivity without any auxiliary electrode, it would invite an increase in electrode resistance. This causes an increase in wiring resistance and a large loss in supply power when arranging a lot of pixels in an X-Y matrix to produce a panel. The auxiliary electrode is introduced only into one electrode of which light is taken out while the other electrode of which no light is taken out may remain to have such a film thickness as to exhibit a sufficiently low resistance value. The auxiliary electrodes may be used on both sides.

FIG. 4 shows a third embodiment that has the features of both the first and second embodiments.

As shown in FIG. 4, there are arranged a support substrate 31, an anode 32, an organic compound layer 33, a hole transportation layer 34, a light emission layer 55, an electron transportation layer 36, an organic compound layer 37 and a cathode 38. The layers 33 and 37 are each composed of an organic compound having a sulfur-atom-containing substituent in a specific structure.

The layers 33 and 37 are independent of each other. The layer 33 has a suitable structure introduced from the molecular structure of a material that composes the hole transportation layer while the layer 37 has a suitable structure introduced from the molecular structure of a material that composes the electron transportation layer. Therefore, the structure of the layer 33 may be one as shown in the first embodiment and the structure of the layer 37 may be one as shown in the second embodiment although they are not limited to these examples.

With respect to the materials of layers other than the layers 33 and 37, these layers may be configured in structure as well as those of the first or second embodiment in free combinations. Other components such as a binder, which are not directly related to the function of the layer, an auxiliary electrode and a buffer layer may also be introduced as well as those of the first and second embodiments, if required.

The present invention will be described below with reference to examples. The scope of the present invention is not limited to these examples so long as they are contained within the gist of the present invention.

Synthesis Example 1

Synthesis of an α-NPD derivative having a mercapto group (—SH) as a sulfur-atom-containing substituent in a specific structure (hereinafter referred to as α-NPD-SH).

A method of synthesizing N,N'-bis(4-(6-mercaptohexyl)phenyl)-N,N'bis(α-naphthy)-1,1'-biphenyl-4,4'-diamine (α-NPD-SH)

The synthesis was carried out in accordance with the following process.

realized with these groups, there is no particular limit in structure to one terminal of the sulfur-containing substituent that is opposite to the other terminal having α-NPD. The structures should be designed so as to achieve a high affinity for α-NPD or a matrix compound.

The skeleton to the sulfur-atom-containing substituent was an alkyl group but is not limited to this. Although sulfur-atom-containing substituents were introduced into para-positions of two phenyl groups, their positions may also be ortho- or meta-positions, and the number of the introduced sulfur-atom-containing substituents is not limited

[Formula 6]

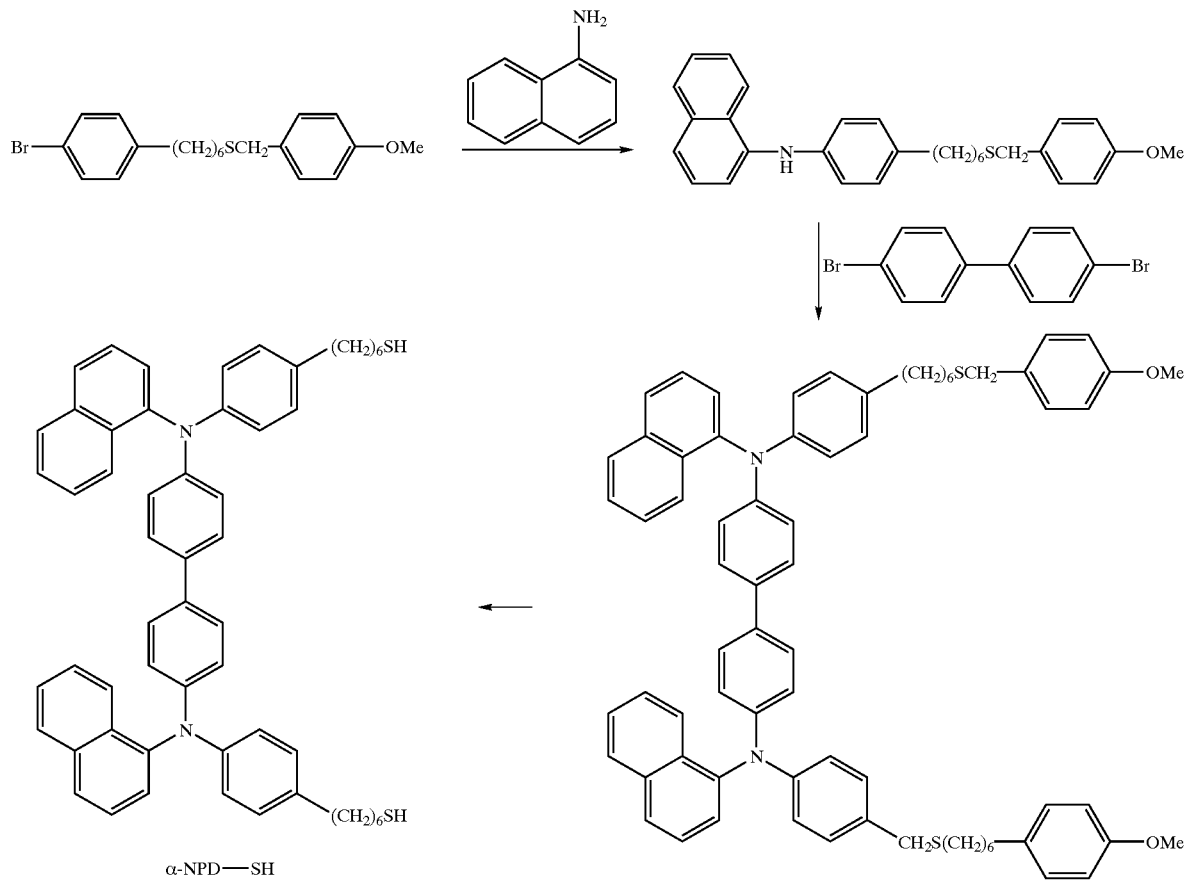

In an orthoxylene solvent, 1-aminonaphthalene was reacted with 4-methoxybenzyl-5-(4-bromobenzyl)pentyl sulfide in the presence of Pd/phosphine and t-butoxy sodium to obtain 4-(6-(4-methoxybenzylthio)hexyl)phenyl-1-naphthylamine. Then, 4,4'-dibromobiphenyl was added into the resultant compound to obtain N,N'-bis(4-(6-(4-methoxybenzylthio)hexyl)phenyl)-N,N'-bis(α-naphtyl)-1,1'-biphenyl-4,4'-diamine through the same reaction. N,N'-bis(4-(6-mercaptohexyl)phenyl)-N,N'-bis(α-naphtyl)-1,1'-biphenyl-4,4'-diamine, the intended product having a mercapto group, was removed from the compound in the presence of anisole in a trifluoroacetic acid. Its structure was confirmed by the elementary analysis or NMR analysis.

The sulfur-atom-containing substituent was realized with a mercapto group in the above-mentioned synthesis example. The substituent, however, is not limited to this example but may be extended to a sulfide group and a disulfide group. If the sulfur-atom-containing substituent is to two. Furthermore, it is not always required to introduce the sulfur-atom-containing substituents into phenyl groups. These substituents may be introduced into positions other than phenyl groups. Any number of such substituents may be introduced into any positions so long as they can maintain their affinity for α-NPD or the matrix compound.

EXAMPLE 1

Sputtering of ITO was carried out over a glass substrate to form a film with a sheet resistance of 20 Ω/☐ in order to obtain a support substrate with an ITO anode. The transmissivity of the substrate was measured 90% or more in a visible range. This indicates that there was a small loss in EL light emission. The term "90%" means the minimum transmissivity in a range of 400–800 nm.

The substrate was then subjected to ultrasonic washing in a neutral cleanser and in isopropyl alcohol in this order and further subjected to ultraviolet-ray (UV)-ozone washing under heating at 100 degree for 5 minutes. The substrate with the electrode was immersed into an ethanol/orthoxylene mixture solution of α-NPD-SH prepared in the Synthesis Example 1 for 12 hours. It was then removed from the solution and lightly washed in an ethanol/orthoxylene mixture solvent without α-NPD-SH. Then, the pressure was reduced down to $1.0\times10^{-1}$ Pa at room temperature in a desiccator to remove the remaining solvent, resulting in the formation of a super thin film of α-NPD-SH. The formation of the super thin film of α-NPD-SH was confirmed by the FT-IR measurement or XPS measurement.

The substrate with the super thin film was set in a substrate holder within a vacuum chamber of commercially available vacuum evaporation equipment. On the other hand, 200 mg of α-NPD was accommodated in a molybdenum boat and 200 mg of Alq was accommodated in another molybdenum boat. Then, the pressure in the vacuum chamber was decreased down to $1.0\times10^{-4}$ Pa. Thereafter, the molybdenum boat that accommodated α-NPD was heated in order to evaporate at 0.1–0.3 nm/s over the ITO of which surface was processed with the above-mentioned α-NPD-SH (strictly speaking, over the surface of the α-NPD-SH super thin film). As a result, a hole transportation layer with a film thickness of 50 nm was formed. Further, Alq was evaporated at an evaporation rate of 0.1–0.2 nm/s to form a light emission layer serving as an electron transportation layer with a film thickness of 70 nm. No particular heating of the substrate was performed during these sequential evaporations of organic layers. The product was once removed from the vacuum chamber and fixed in the substrate holder again after a stainless mask was disposed.

Next, 2 g of magnesium ribbon were accommodated in a tungsten boat and further 1 g of silver wire was accommodated in another tungsten boat. These boats were loaded into the vacuum chamber, which was then evacuated. After the internal pressure of the vacuum chamber reached down to $1.0\times10^{-4}$ Pa, silver was evaporated at an evaporation rate of 0.1 nm/s to plate the light emission layer serving as the electron transportation layer. At the same time, magnesium was evaporated at an evaporation rate of 1.0 nm/s to plate the light emission layer serving as the electron transportation layer. When the total film thickness of the formed magnesium film reached up to 100 nm, the evaporation of magnesium stopped and thereafter only the evaporation of sliver continued to increase the film thickness by another 100 nm, resulting in the production of a cathode. No particular heating was performed during the formation of the cathode. Thereafter, an organic EL device was removed from the substrate holder and quickly introduced into a globe box under dry nitrogen ambience, which was then sealed with a cap and adhesive.

Comparative Example 1

An organic EL device was obtained in the same way as EXAMPLE 1 except for omitting the steps of processing the surface of ITO with α-NPD-SH and forming the super thin film with the α-NPD derivative containing a mercapto group.

EXAMPLE 2

In the same way as EXAMPLE 1, sputtering of ITO was carried out over a glass substrate to form a film with a sheet resistance of 20 Ω/□ in order to obtain a support substrate with an ITO auxiliary electrode. The substrate was then subjected to ultrasonic washing in a neutral cleanser and in isopropyl alcohol in this order and further subjected to UV-ozone washing under heating at 110° C. for 5 minutes.

The substrate was quickly set in a substrate holder within a vacuum chamber of commercially available vacuum evaporation equipment. On the other hand, 5 g of gold was accommodated in a tungsten boat. Then, the internal pressure of the vacuum chamber was decreased down to $1.0\times10^{-4}$ Pa. At this moment, a mask was set directly beneath the substrate so as to form the same shape as the ITO pattern. Thereafter, the tungsten boat that accommodated gold was heated in order to evaporate at 0.5–1.0 nm/s over the ITO film. The substrate was simultaneously heated up to about 250° C. As a result, an anode with a film thickness of 10 nm was formed. In this example, gold was used for the anode and ITO was used for the auxiliary electrode.

The substrate was removed from the vacuum chamber and then immersed into an ethanol/orthoxylene mixture solution of α-NPD-SH prepared in the Synthesis Example 1 for 12 hours. It was then removed from the solution and lightly washed in an ethanol/orthoxylene mixture solvent without α-NPD-SH. Then, the substrate was taken out of the solution and the pressure was reduced down to $1.0\times10^{-1}$ Pa at room temperature in a desiccator to remove the remaining solvent, resulting in the formation of a super thin film of α-NPD-SH. The formation of the super thin film of α-NPD-SH was confirmed by the FT-IR measurement or XPS measurement.

The transmissivity of the substrate with the anode (the glass substrate with ITO on which the gold film was formed) in a visible range was measured 60% or more before it was immersed into the ethanol/orthoxylene mixture solution of α-NPD-SH. This indicates that there is a small loss in EL light emission. The term "60%" means the minimum transmissivity in a range of 400–800 nm. It was confirmed by the FT-IR measurement and XPS measurement that the super thin film of α-NPD-SH was formed to reform the gold surface.

Next, the substrate with the super thin film was set in a substrate holder within the vacuum chamber again. On the other hand, 200 mg of α-NPD was accommodated in a molybdenum boat and 200 mg of Alq was accommodated in another molybdenum boat. Then, the internal pressure of the vacuum chamber was decreased down to $1.0\times10^{-4}$ Pa. Thereafter, the molybdenum boat that accommodated α-NPD was heated in order to evaporate at 0.1–0.3 nm/s over the gold electrode of which surface was processed with the above-mentioned α-NPD-SH (strictly speaking, over the α-NPD-SH super thin film formed on the gold surface). As a result, a hole transportation layer with a film thickness of 50 nm was formed. Further, Alq was evaporated at an evaporation rate of 0.1–0.2 nm/s to form a light emission layer serving as an electron transportation layer with a film thickness of 70 nm. No particular heating of the substrate was performed during these sequential evaporations of organic layers. The product was once removed from the vacuum chamber and fixed in the substrate holder again after a stainless mask was disposed.

Next, 2 g of magnesium ribbon was accommodated in a tungsten boat and also 1 g of silver wire was accommodated in another tungsten boat. These boats were loaded into the vacuum chamber, which was then evacuated. After the internal pressure of the vacuum chamber reached down to $1.0\times10^{-4}$ Pa, silver was evaporated at an evaporation rate of 0.1 nm/s to plate the light emission layer serving as the electron transportation layer. At the same time, magnesium was evaporated at an evaporation rate of 1.0 nm/s to plate the light emission layer serving as the electron transportation layer. When the total film thickness of the formed magnesium film reached up to 100 nm, the evaporation of magnesium stopped and thereafter only the evaporation of sliver continued to increase the film thickness by another 100 nm, resulting in the production of a cathode. No particular heating of the substrate was performed during the formation of the cathode. Thereafter, an organic EL device was removed from the substrate holder and quickly introduced into a globe box under dry nitrogen ambience, which was then sealed with a cap and adhesive.

Comparative Example 2

An organic EL device was obtained in the same way as EXAMPLE 2 except for omitting the steps of processing the surface of the gold anode with α-NPD-SH and forming the super thin film with the α-NPD derivative containing a mercapto group.

Synthesis Example 2

Synthesis of a TAZ derivative having a mercapto group (—SH) as a sulfur-atom-containing substituent in a specific structure.

A method of synthesizing 3-(4-biphenylyl)-4-(4-(6-mercaptohexyl)phenyl)-5-(4-t-butylphenyl)-1,2,4-triazole (hereinafter referred to as TAZ-SH).

The synthesis was carried out in accordance with the following process.

Hydrazine hydrate was reacted with 4-t-butylbenzoic ethyl to obtain 4-t-butylbenzohydrazide, which was then subjected to a dehydrochlorination reaction with 4-phenylbenzoyl chloride, resulting in the formation of 1-(4-biphenylyl)-4-(4-t-butylphenyl)hydrazide. The resultant was further subjected to a cyclization reaction with 4-methoxybenzyl-5-(4-aminobenzyl)pentyl sulfide in the presence of phosphorus trichloride in an orthodichlorobenzene solvent to obtain 3-(4-biphenylyl)-4-(4-(6-(4-methoxybenzylthio)hexyl)phenyl)-5-(4-t-butylphenyl)-1,2,4-triazole. Then, p-methoxybenzyl group, the protecting group, was removed from the resultant product in the same way as Synthesis Example 1 to obtain 3-(4-biphenylyl)-4-(4-(6-mercaptohexyl)phenyl)-5-(4-t-butylphenyl)-1,2,4-triazole. The structure was confirmed by the elementary analysis or NMR analysis.

Although a mercapto group in the above-mentioned Synthesis Example realizes the sulfur-atom-containing substituent, there is no limit to this example. The substituent may be extended to a sulfide group and a disulfide group. If the sulfur-atom-containing substituent is realized with these groups, there is no particular limit in structure to one terminal of the sulfur-containing substituent that is opposite to the other terminal having a TAZ derivative. The structures should be designed so as to achieve a high affinity for a matrix compound or TAZ.

The skeleton to the sulfur-atom-containing substituent was an alkyl group but is not limited to this. Although the sulfur-atom-containing substituent was introduced into the para-position of a phenyl group on the 4-position of a triazole ring, the position may also be the ortho- or meta-position, and the number of the substituent is not limited to one. Furthermore, it is not always required to introduce the sulfur-atom-containing substituent into phenyl groups. These substituents may be introduced into positions other than phenyl groups. Any number of such substituents may be introduced into any positions so long as they can maintain their affinity for their matrix compound (in this case, TAZ).

EXAMPLE 3

The same support substrate with ITO as used in the EXAMPLE 1 was washed in the same way as EXAMPLE 1. The substrate was quickly set in a substrate holder within a vacuum chamber of commercially available vacuum evaporation equipment. On the other hand, 2 g of magnesium ribbon was accommodated in a tungsten boat and also 1 g of silver wire was accommodated in another tungsten boat. These boats were loaded into the vacuum chamber, which was then evacuated. After the internal pressure of the vacuum chamber reached down to $1.0 \times 10^{-4}$ Pa, silver was evaporated at an evaporation rate of 0.1 nm/s to plate the above-mentioned support substrate with ITO. At the same time, magnesium was evaporated at an evaporation rate of 1.0 nm/s. When the total thickness of silver and magnesium films reached up to 10 nm, the shutter closed, resulting in the formation of a cathode.

In this example, a magnesium-silver alloy was used for the cathode and ITO was used for the auxiliary electrode. The substrate was removed from the vacuum chamber and then immersed into an ethanol/orthodichlorobenzene mixture solution of TAZ-SH for 10 hours. The substrate was then lightly washed in an ethanol/orthodichlorobenzene mixture solution without TAZ-SH. Then, the substrate was taken out of the solution and the pressure was reduced down

[Formula 7]

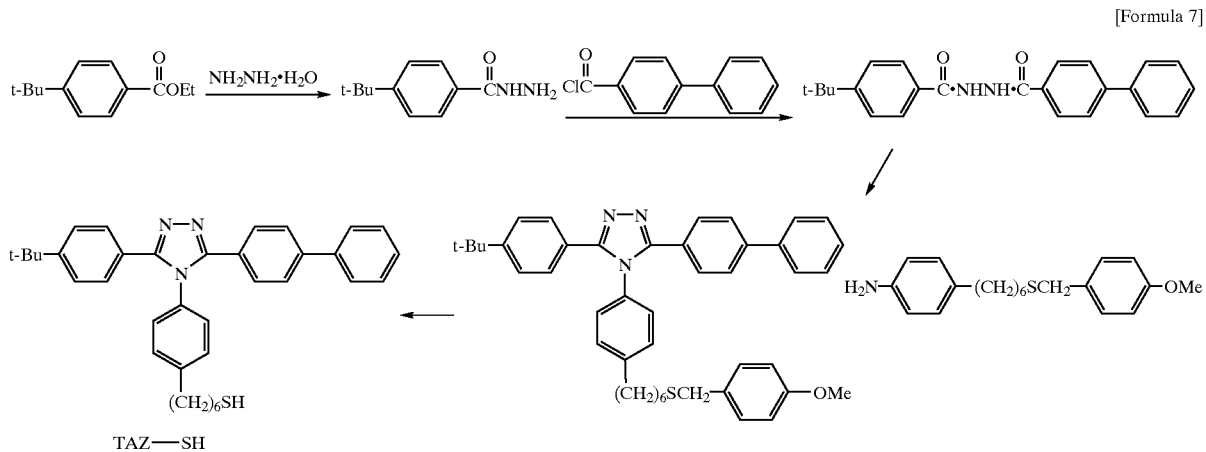

to $1.0 \times 10^{-1}$ Pa in a desiccator to remove the remaining solvent, resulting in the formation of the super thin film of TAZ-SH to reform the cathode surface.

The transmissivity of the substrate with the cathode (the glass substrate with ITO on which the silver and magnesium films were formed) in a visible range was measured 60% or more before it was immersed into the solution. This indicates that there was a small loss in EL light emission. The term "60%" means the minimum transmissivity in a range of 400–800 nm. It was confirmed by the FT-IR measurement and XPS measurement that the super thin film of TAZ-SH was formed to reform the cathode surface.

Next, the substrate with the super thin film was set in a substrate holder within the vacuum chamber again. On the other hand, 200 mg of TAZ was accommodated in a molybdenum boat, 200 mg of Alq was accommodated in another molybdenum boat and 200 mg of α-NPD was accommodated in a different boat. These boats were introduced into the vacuum chamber, which was then evacuated. When the internal pressure of the vacuum chamber was decreased down to $1.0 \times 10^{-4}$ Pa, the molybdenum boat that accommodated TAZ was heated in order to evaporate at 0.1–0.3 nm/s over the cathode of which surface was processed with the above-mentioned TAZ-SH (strictly speaking, over the surface of the TAZ-SH super thin film on the cathode surface). As a result, an electron transportation layer with a film thickness of 50 nm was formed. Further, the molybdenum boat that accommodated Alq was heated in order to evaporate at an evaporation rate of 0.1–0.2 nm/s to form a light emission layer with a film thickness of 50 nm. Thereafter, the boat that accommodated α-NPD was heated in order to evaporate at an evaporation rate of 0.1–0.3 nm/s to form a hole transportation layer with a film thickness of 50 nm. No particular heating of the substrate was performed during these sequential evaporations of organic layers. The product was once removed from the vacuum chamber and fixed in the substrate holder again after a stainless mask was disposed.

Next, 2 g of gold was accommodated in a tungsten boat that was introduced into the vacuum chamber, which was then evacuated. After the internal pressure of the vacuum chamber was decreased down to $1.0 \times 10^{-4}$ Pa, gold was evaporated at an evaporation rate of 0.1 nm/s over the hole transportation layer to form an anode with a thickness of 200 nm in order to complete an organic EL device. Thereafter, the organic EL device was removed from the substrate holder and quickly introduced into a globe box under dry nitrogen ambience, which was then sealed with a cap and adhesive.

Comparative Example 3

An organic EL device was obtained in the same way as EXAMPLE 3 except for omitting the steps of processing the surface of the magnesium-silver alloy electrode with TAZ-SH and forming the super thin film with the TAZ derivative containing a mercapto group.

The durability and variations in power consumption at the time of driving were observed on each of the organic EL devices produced through the above-mentioned processes. Each organic EL device was driven with a constant current to meet with an initial brightness of 300 cd/m$^2$, and the generation of dark spots and the applied voltage were monitored. The number of dark spots in the light emission surface was counted with the naked eye through a glass that magnifies 10 times. The initial applied voltage of EXAMPLES 1, 2 and 3 was the same as that of their corresponding COMPARATIVE EXAMPLES 1, 2 and 3, respectively. The results are shown in Table 1.

The Table 1 indicates that the organic EL device according to the present invention can suppress the generation of dark spots and is a device with a small increase in applied voltage at the time of driving with a constant current, that is, a smaller increase in power consumption.

There is no change in initial applied voltage even when α-NPD-SH and TAZ-SH are introduced therein. That is, the method of the present invention causes no disadvantages. Moreover, EXAMPLES 1, 2 and 3 and COMPARATIVE EXAMPLES 1, 2 and 3 are quite different from one another in device composition. Therefore, it is natural that EXAMPLES 1, 2 and 3 and COMPARATIVE EXAMPLES 1, 2 and 3 should be different from one another in initial applied voltage needed to obtain a value of 300 cd/m$^2$.

TABLE 1

|  | The number of dark spots after 1000-hour driving (initial brightness: 300 cd/m$^2$) | Increase in applied voltage (V) |
| --- | --- | --- |
| EXAMPLE 1 | 2 | 1.2 |
| EXAMPLE 2 | 3 | 0.8 |
| EXAMPLE 3 | 2 | 1.3 |
| COMPARATIVE EXAMPLE 1 | 12 | 3.3 |
| COMPARATIVE EXAMPLE 2 | 15 | 3.0 |
| COMPARATIVE EXAMPLE 3 | 11 | 3.6 |

As obvious from the above-mentioned description, according to the present invention, the generation of dark spots and the increase of power consumption can be suppressed by introducing an organic compound having a sulfur-atom-containing substituent in a specific structure into the interface between an electrode and a carrier transportation layer. Therefore, it is possible to manufacture an organic EL device with an excellent durability and a smaller increase in power consumption and also panels using the device.

Because the embodiments consistent with the present invention have been described mentioned above, other embodiments and variations consistent with the present invention will be apparent to those skilled in the art. Therefore, the scope of the invention should not be viewed as limited to the disclosed embodiments but rather should be viewed as limited only by the spirit and scope of the appended claims.

What is claimed is:

1. An organic electroluminescent device comprising:
   a negative electrode;
   a positive electrode; and
   at least a one-layered organic compound thin film including a light emission layer between said electrodes,
   wherein at least one of said electrodes is composed of one of a metal oxide, a metal selected from the group consisting of copper and noble metals and alloys thereof, and a semiconductor compound,
   wherein a thin film composed of an organic compound having a sulfur-atom-containing substituent is sandwiched between at least one of said electrodes and said organic compound thin film, and
   wherein said organic compound having the sulfur-atom-containing substituent comprises at least one of:

an organic compound having an alkyl mercapto group represented by —(CH$_2$)$_n$SH wherein n is an integer of 1–10;

N,N'-bis(4-(6-mercaptohexyl)phenyl)-N,N'-bis(α-naphthyl)-1,1'-biphenyl-4,4'-diamine; and 3-(4-biphenylyl)-4-(4-(6-mercaptohexyl)phenyl)-5-(4-t-butylphenyl)-1,2,4-triazole.

2. An organic electroluminescent device comprising:

a negative electrode;

a positive electrode; and at least a one-layered organic compound thin film including a light emission layer between said electrodes, wherein at least one of said electrodes is composed of one of a metal oxide, a metal selected from the group consisting of copper and noble metals and alloys thereof, and a semiconductor compound, wherein a thin film composed of an organic compound having a sulfur-atom-containing substituent is sandwiched between at least one of said electrodes and said organic compound thin film, and wherein said organic compound having the sulfur-atom-containing substituent comprises at least one of:

an organic compound having an alkyl mercapto group;

an organic compound having a sulfide group; and an organic compound having a disulfide group.

3. An organic electroluminescent device comprising:

a negative electrode;

a positive electrode; and at least a one-layered organic compound thin film including a light emission layer between said electrodes, wherein at least one of said electrodes is composed of one of a metal oxide, a metal selected from the group consisting of copper and noble metals and alloys thereof, and a semiconductor compound, wherein a thin film composed of an organic compound having a sulfur-atom-containing substituent is sandwiched between at least one of said electrodes and said organic compound thin film, and the device further comprising an auxiliary electrode with a light transmissivity of 70% or more provided on the rear surface of said electrode which is surface-reformed using said organic compound having the sulfur-atom-containing substituent.

4. An organic electroluminescent panel comprising an electroluminescent device, said device including:

a negative electrode;

a positive electrode; and at least a one-layered organic compound thin film including a light emission layer between said electrodes, wherein at least one of said electrodes is composed of one of a metal oxide, a metal selected from the group consisting of copper and noble metals and alloys thereof, and a semiconductor compound, wherein a thin film composed of an organic compound having a sulfur-atom-containing substituent is sandwiched between at least one of said electrodes and said organic compound thin film, and wherein said organic compound having the sulfur-atom-containing substituent comprises at least one of:

an organic compound having an alkyl mercapto group represented by —(CH$_2$)$_n$SH wherein n is an integer of 1–10;

N,N'-bis(4-(6-mercaptohexyl)phenyl)-N,N'-bis(α-naphthyl)-1,1'-biphenyl-4,4'-diamine; and 3-(4-biphenylyl)-4-(4-(6-mercaptohexyl)phenyl)-5-(4-t-butylphenyl)-1,2,4-triazole.

5. An organic electroluminescent panel comprising an electroluminescent device, said device including:

a negative electrode;

a positive electrode; and at least a one-layered organic compound thin film including a light emission layer between said electrodes, wherein at least one of said electrodes is composed of one of a metal oxide, a metal selected from the group consisting of copper and noble metals and alloys thereof, and a semiconductor compound, wherein a thin film composed of an organic compound having a sulfur-atom-containing substituent is sandwiched between at least one of said electrodes and said organic compound thin film, and wherein said organic compound having the sulfur-atom-containing substituent comprises at least one of:

an organic compound having an alkyl mercapto group;

an organic compound having a sulfide group; and an organic compound having a disulfide group.

6. An organic electroluminescent panel comprising an electroluminescent device, said device including:

a negative electrode;

a positive electrode; and at least a one-layered organic compound thin film including a light emission layer between said electrodes, wherein at least one of said electrodes is composed of one of a metal oxide, a metal selected from the group consisting of copper and noble metals and alloys thereof, and a semiconductor compound, wherein a thin film composed of an organic compound having a sulfur-atom-containing substituent is sandwiched between at least one of said electrodes and said organic compound thin film, and the electroluminsecent panel further comprising an auxiliary electrode with a light transmissivity of 70% or more provided on the rear surface of said electrode which is surface-reformed with said organic compound having the sulfur-atom-containing substituent.

7. A process of manufacturing an organic electroluminescent device, comprising the steps of:

immersing an electrode into a solution of an organic compound having a sulfur-atom-containing substituent to reform the surface of said electrode; and forming a thin film composed of said organic compound having the sulfur-atom-containing substituent between said electrode and an organic compound thin film, wherein the sulfur-atom-containing substituent comprises at least one of:

an organic compound having an alkyl mercapto group represented by —(CH$_2$)$_n$SH wherein n is an integer of 1–10;

N,N'-bis(4-(6-mercaptohexyl)phenyl)-N,N'-bis(α-naphthyl)-1,1'-biphenyl-4,4'-diamine; and 3-(4-biphenylyl)-4(4-(6-mercaptohexyl)phenyl)-5-(4-t-butylphenyl)-1,2,4-triazole.

8. A process of manufacturing an organic electroluminescent panel, comprising the steps of:
- immersing an electrode into a solution of an organic compound having a sulfur-atom-containing substituent to reform the surface of said electrode; and
- forming a thin film composed of said organic compound having the sulfur-atom-containing substituent between said electrode and an organic compound thin film,
- wherein the sulfur-atom-containing substituent comprises at least one of:
  - an organic compound having an alkyl mercapto group represented by $-(CH_2)_n SH$ wherein n is an integer of 1–10;
  - N,N'-bis(4-(6-mercaptohexyl)phenyl)-N,N'-bis(α-naphthyl)-1,1'-biphenyl-4,4'-diamine; and
  - 3-(4-biphenylyl)-4-(4-(6-mercaptohexyl)phenyl)-5-(4-t-butylphenyl)-1,2,4-triazole.

* * * * *